(12) United States Patent
Cheng et al.

(10) Patent No.: US 11,501,999 B2
(45) Date of Patent: Nov. 15, 2022

(54) COBALT FILL FOR GATE STRUCTURES

(71) Applicant: Taiwan Semiconductor Manufacturing Co., Ltd., Hsin-Chu (TW)

(72) Inventors: Chung-Liang Cheng, Changhua County (TW); Ziwei Fang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/526,572

(22) Filed: Jul. 30, 2019

(65) Prior Publication Data

US 2020/0105594 A1 Apr. 2, 2020

Related U.S. Application Data

(60) Provisional application No. 62/738,206, filed on Sep. 28, 2018.

(51) Int. Cl.
| | | |
|---|---|---|
| *H01L 21/768* | (2006.01) | |
| *H01L 21/02* | (2006.01) | |

(52) U.S. Cl.
CPC .... *H01L 21/76877* (2013.01); *H01L 21/0217* (2013.01); *H01L 21/0228* (2013.01); *H01L 21/02153* (2013.01); *H01L 21/76816* (2013.01); *H01L 21/76873* (2013.01)

(58) Field of Classification Search
CPC ......... H01L 21/76877; H01L 21/76873; H01L 21/0228
See application file for complete search history.

(56) References Cited

U.S. PATENT DOCUMENTS

| | | | | |
|---|---|---|---|---|
| 5,834,372 | A * | 11/1998 | Lee ........................ | C23C 16/02 438/677 |
| 9,640,482 | B1 * | 5/2017 | Chen ................. | H01L 21/28518 |
| 2002/0037615 | A1 * | 3/2002 | Matsuo ........... | H01L 21/823842 438/241 |
| 2006/0014385 | A1 * | 1/2006 | Kim .................. | H01L 27/10817 438/680 |
| 2007/0017445 | A1 * | 1/2007 | Takehara ................ | C23C 16/54 118/719 |
| 2012/0252207 | A1 * | 10/2012 | Lei ..................... | H01L 21/76834 438/653 |
| 2014/0295659 | A1 * | 10/2014 | Lim .................. | H01L 21/28008 438/591 |

(Continued)

*Primary Examiner* — Michele Fan
(74) *Attorney, Agent, or Firm* — Haynes and Boone, LLP

(57) ABSTRACT

A method for forming a gate structure includes forming a trench within an interlayer dielectric layer (ILD) that is disposed on a semiconductor substrate, the trench exposing a top surface of the semiconductor substrate, forming an interfacial layer at a bottom of the trench, forming a dielectric layer within the trench, forming a work function metal layer on the dielectric layer, forming an in-situ nitride layer on the work function metal layer in the trench, performing a first cobalt deposition process to form a cobalt layer within the trench, performing a second cobalt deposition process to increase a thickness of the cobalt layer within the trench, and performing an electrochemical plating (ECP) process to fill the trench with cobalt.

20 Claims, 14 Drawing Sheets

(56) References Cited

U.S. PATENT DOCUMENTS

| | | | |
|---|---|---|---|
| 2016/0056077 A1* | 2/2016 | Lai | H01L 21/02247 |
| | | | 438/653 |
| 2016/0379879 A1* | 12/2016 | Hotta | H01L 21/28562 |
| | | | 438/656 |
| 2017/0032972 A1* | 2/2017 | Tsai | H01L 21/28088 |
| 2017/0250117 A1* | 8/2017 | Kannan | H01L 29/4966 |
| 2017/0352597 A1* | 12/2017 | Adusumilli | H01L 21/32115 |
| 2018/0174965 A1* | 6/2018 | Kamineni | H01L 21/76883 |
| 2019/0157161 A1* | 5/2019 | Balakrishnan | H01L 29/1066 |
| 2019/0214230 A1* | 7/2019 | Cui | H01L 21/28518 |

* cited by examiner

COBALT FILL FOR GATE STRUCTURES

PRIORITY INFORMATION

This application claims priority to U.S. Provisional Patent No. 62/738,206 filed Sep. 28, 2018 and entitled "Gate Resistance Reduction by ECP Cobalt Plating," the disclosure of which is hereby incorporated by reference in the entirety.

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

Integrated circuits include a variety of circuit device components, such as transistors. One characteristic of a transistor device is its threshold voltage. As transistor sizes become smaller, it is desirable to reduce the threshold voltage. It is desirable to find ways to reduce the threshold voltage without adversely affecting other aspects of the transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
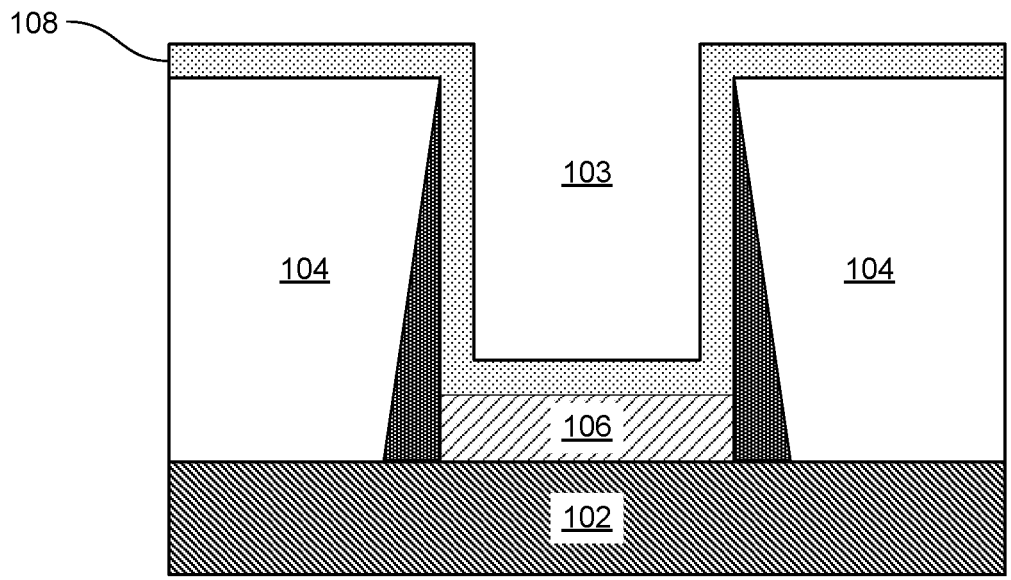
FIGS. 1A-1M are diagrams showing an illustrative process for forming a gate structure of an n-type transistor with a cobalt fill, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, it is desirable to find ways to reduce the threshold voltage without adversely affecting other aspects of the transistor. One way to reduce threshold voltage is to increase the thickness of the work function metal layer that is part of the gate structure of a transistor. However, increasing the size of the work function metal layer becomes more difficult when producing smaller circuits.

According to principles described herein, a gate structure uses a cobalt fill rather than a tungsten fill. The cobalt fill is formed using a variety of processes. First, a glue layer is formed within a trench. The glue layer may be a nitride layer, for example, and is used to provide better adhesion for the cobalt fill. Then, a first cobalt deposition process is applied. The first cobalt deposition process may be a Physical Vapor Deposition (PVD) process. Then, a second cobalt deposition process is applied. The second deposition process may be a Chemical Vapor Deposition (CVD) process. Then, an Electro-Chemical Plating (ECP) process is performed to finish the cobalt fill. Using a cobalt fill formed in the manner described herein allows for a lower threshold voltage without having to increase the size of the work-function metal layer.

FIGS. 1A-1M are diagrams showing an illustrative process for forming a gate structure of an n-type transistor with a cobalt fill. According to the present example, an Interlayer Dielectric Layer (ILD) 104 formed on a substrate 102. The substrate 102 may be a semiconductor substrate such as a silicon substrate. In one example, the substrate 102 may be part of a silicon wafer. In some examples, the substrate 102 may be part of a fin structure formed onto a substrate.

The ILD layer 104 may be deposited onto the substrate using a deposition process. In some examples, to form the trench 103, a dummy layer is formed on the substrate 102. The dummy layer may then be patterned to form dummy gates. Sidewall spacers may also be formed on sidewalls of the dummy gates. The ILD layer 104 may then be deposited over the dummy gates. The dummy gates may then be removed, thus leaving the trench 103 as defined by the sidewall spacers. In some examples, the trench 103 may be formed using photolithographic processes. The trench 103 may correspond to where a gate structure is to be formed. Thus, the trench 103 becomes the location at which a gate stack is to be formed. The trench 103 may be patterned into the ILD layer 104 using a photolithographic process. Specifically, a photoresist may be deposited and exposed to a light source through a mask. The photoresist may then be developed with a developing solution to remove soluble components of the mask. An etching process may then be applied through the patterned photoresist to create the trench 103. This etching process may expose the underlying substrate 102.

After the trench 103 is created, an interfacial layer 106 may be formed within the trench 103. The interfacial layer 106 is formed at the bottom of the trench and is not formed on the sidewalls of the trench 103. The interfacial layer 106 may be used to allow better adhesion of the high-k dielectric layer 108 to the substrate 102.

The high-k dielectric layer 108 may be, for example, hafnium oxide (e.g., $HfO_2$, $HfZrO_2$, $HfLaO_2$). Other dielectric materials may be used as well. The high-k dielectric layer 108 may be formed conformally within the trench. In other words, the high-k dielectric layer 108 is formed along both the sidewalls and bottom of the trench 103.

Figure 1B:
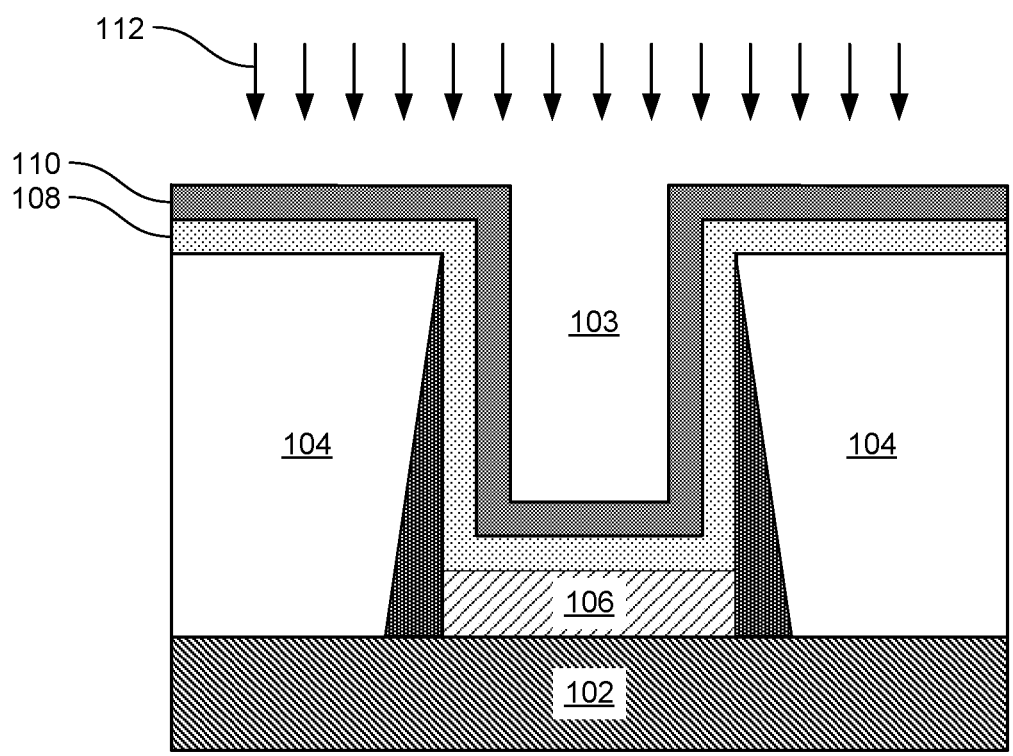

FIG. 1B illustrates the formation of a titanium silicon nitride (TiSiN) layer 110 followed by a post-metal annealing process 112. The TiSiN layer 110 may be formed conformally directly on the high-k dielectric layer 108. The annealing process 112 is then applied to cause diffusion into the high-k dielectric layer 108 to improve the properties of the high-k dielectric layer 108. The post-metal annealing process 112 may be applied at a temperature of about 850 degrees Celsius. The post-metal annealing process 112 may also utilize a nitrogen gas. The post-metal annealing process 112 may be applied in-situ. In other words, the process 112 is applied in the same chamber after the TiSiN layer 110 is formed.

Figure 1C:
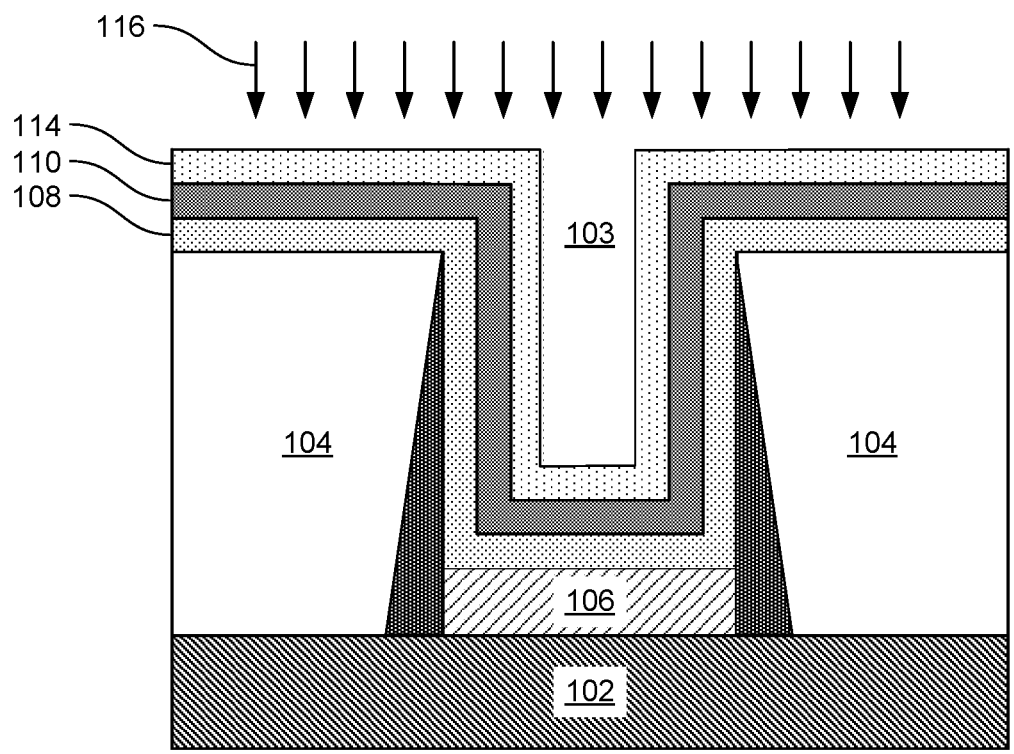

FIG. 1C illustrates the formation of a silicon capping layer 114 followed by a post-capping annealing process 116. The silicon capping layer 114 may be formed conformally over the TiSiN layer 114. The silicon capping layer may have a thickness within a range of about 20-40 Angstroms. The post-capping annealing process 116 may be applied at a temperature of about 900 degrees Celsius. The post-capping annealing process 116 may also utilize a nitrogen gas.

Figure 1D:
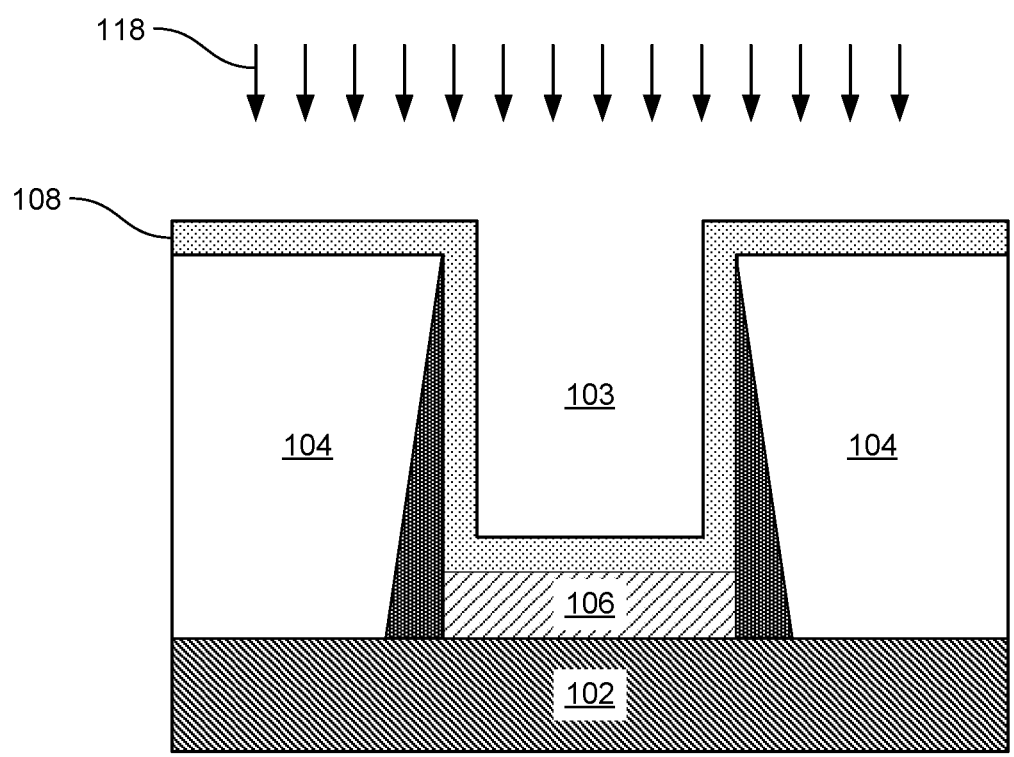

FIG. 1D illustrates a removal process 118 to remove the TiSiN layer 110 and the silicon capping layer 114. In some examples, the removal process includes two separate and distinct processes; one to remove the TiSiN layer 110 and one to remove the silicon capping layer 114. The layers 110, 114 may be removed using various etching processes. The etching processes may be selective so as to remove the layers 110, 114 without substantially affecting the high-k dielectric layer 108.

Figure 1E:
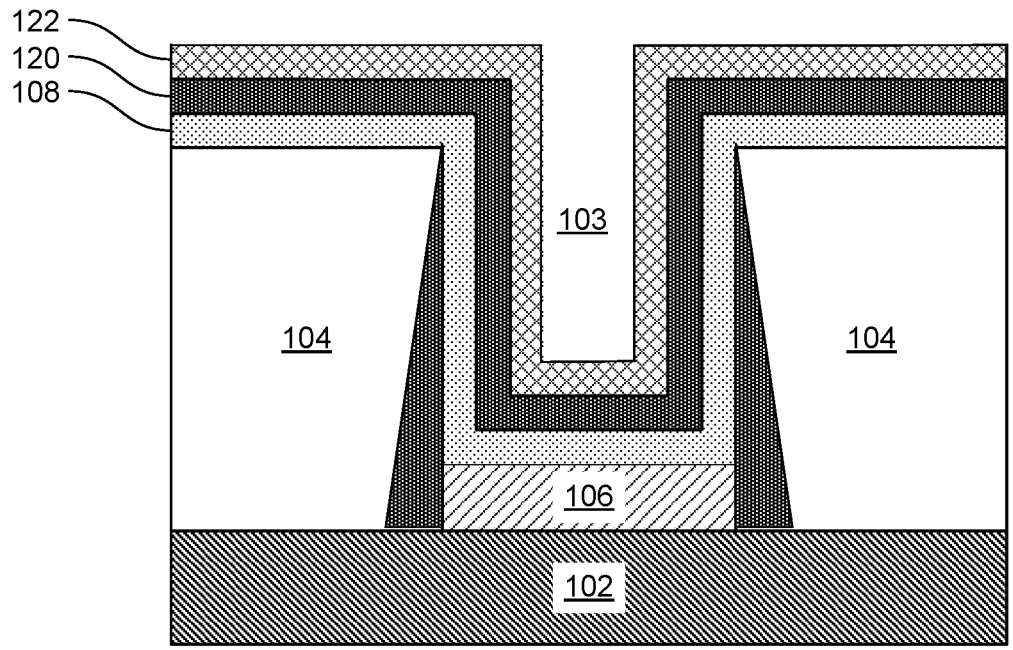

FIG. 1E illustrates the deposition of a work function layer. The work function layer includes a titanium aluminum carbide (TiAlC) layer 120 and a titanium nitride (TiN) layer. Such layers may be formed using deposition processes. The work function layers 120, 122 are used for giving the gate structure desirable properties.

Figure 1F:
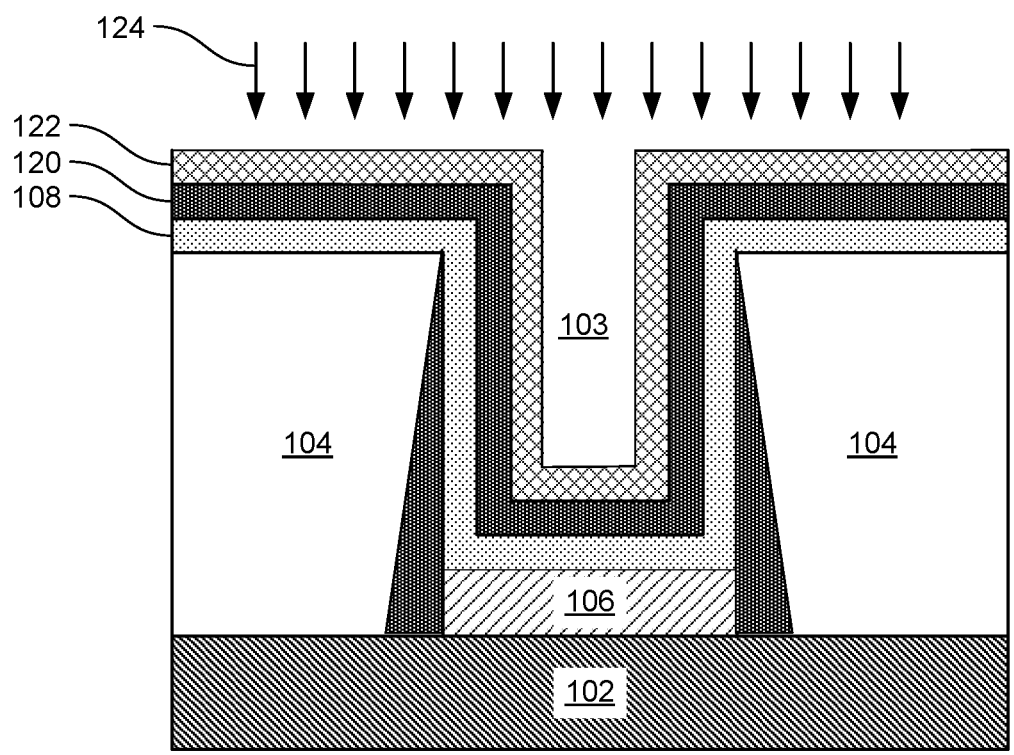

FIG. 1F illustrates a cleaning process 124 to remove oxidation that forms on the titanium nitride layer. Such oxidation may form on the surface when transporting the wafer from one chamber to another. The cleaning process may involve using tungsten chloride (WCl5) or tantalum chloride (TaCl5). The cleaning process 124 may be applied at a temperature within a range of about 300-500 degrees Celsius. In some examples, the cleaning process 124 is applied at a pressure within a range of about 5-15 torr. Other cleaning mechanisms may be used as well.

Figure 1G:
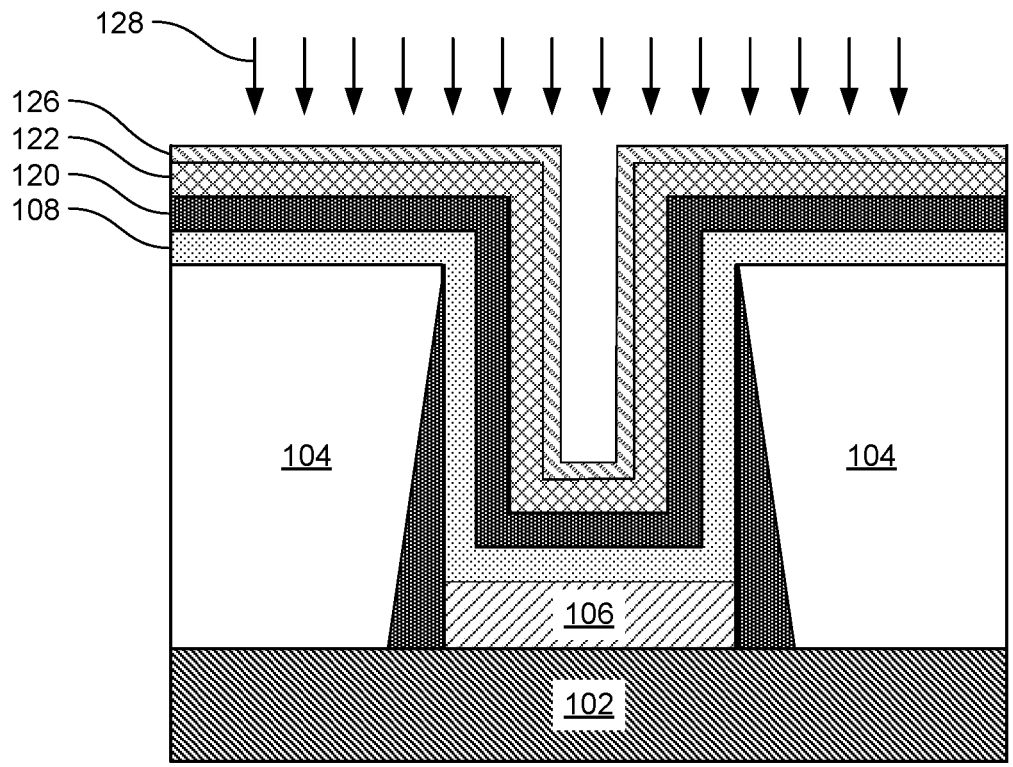

FIG. 1G illustrates the formation of a glue layer 126. The glue layer 126 may be, for example, a titanium nitride layer. In one example, the titanium nitride glue layer 126 is formed using an atomic layer deposition (ALD) process 128. ALD involves depositing alternating types of small layers in a self-limiting manner until the desired thickness is reached.

In some examples, the glue layer 126 may be formed using about 40-80 ALD cycles. The temperature for the ALD process may be within a range of about 400-450 degrees Celsius. In some examples, the ALD process may use titanium chloride (TiCl4) or ammonia (NH3) as a precursor.

Figure 1H:
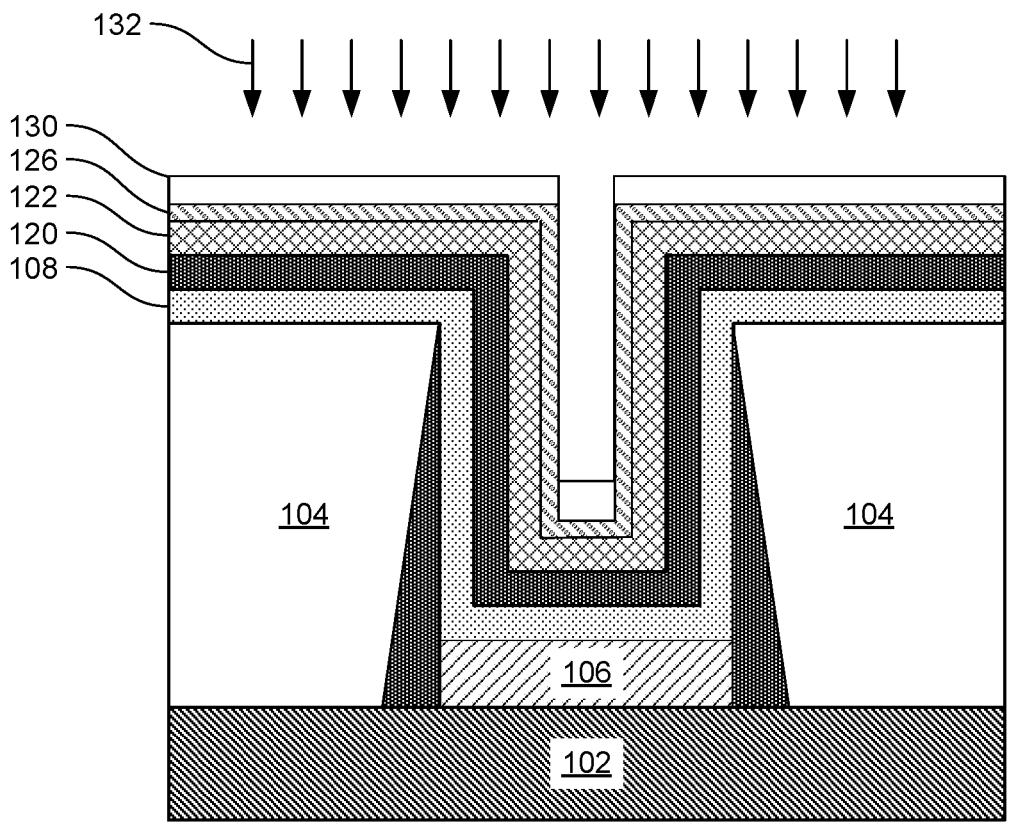

FIG. 1H illustrates a first cobalt deposition process 132. The first cobalt deposition process 132 forms a cobalt layer 130 on the glue layer 126. The first cobalt deposition process may be a PVD process. In some examples, the PVD process may be a directional PVD process. Thus, the first cobalt deposition process 132 results in more material on the bottom of the trench than on the sidewalls of the trench. The PVD process 132 may form the cobalt layer 130 with a thickness within a range of about 10-30 Angstroms.

Figure 1I:
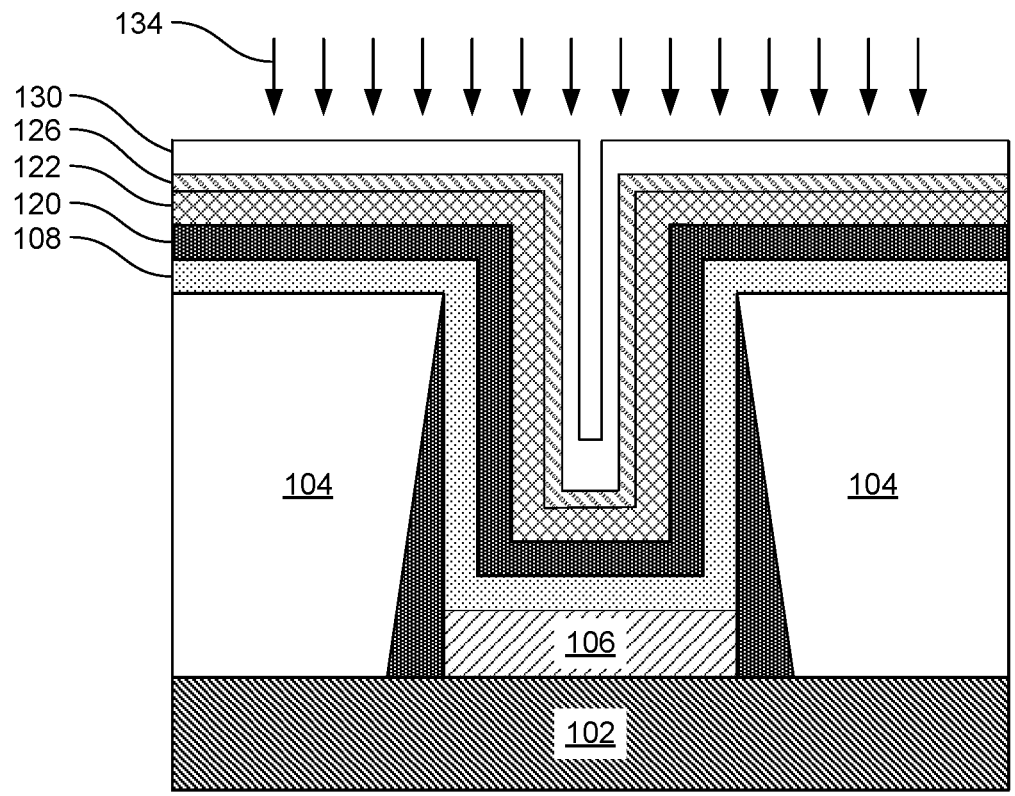

FIG. 1I illustrates a second cobalt deposition process 134. The second cobalt deposition process 134 increases the thickness of the cobalt layer 130. The second cobalt deposition process 134 may be a CVD process or a Plasma Enhanced CVD (PECVD) process. The CVD process may be a non-directional process and thus will form material on sidewalls of the trench as thick as on the bottom of the trench. The CVD deposition process may increase the thickness of the cobalt layer within a range of about 10-30 Angstroms. The CVD deposition process 134 may be applied at a temperature within a range of about 150-250 degrees Celsius. The CVD deposition process may have a pressure within a range of about 5-15 torr. The CVD deposition process may use dicobalt hexacarbonyl tert-butyl acetylene (CCTBA) and hydrogen (H2) plasma as a precursor.

The cobalt layer 130 acts as a seed layer for the ECP cobalt formation process 136. Because the first cobalt deposition process 132 is a directional process, it forms more material on the bottom of the trench than on the sidewalls of the trench. In order to get the seed layer formed on the sidewalls, the second cobalt deposition process 134 is used. Having a cobalt layer 130 with a thicker bottom than the sidewalls provides various advantages. Specifically, having a cobalt layer 130 with a thicker bottom than the sidewalls allows the ECP process to be applied more effectively. Also, a cobalt layer 130 with a thicker bottom than the sidewalls improves the reflow process that occurs during the annealing process. Specifically, experimentation has shown that having a cobalt layer 130 with a greater thickness on the bottom reduces the formation of voids during the reflow process and reduces the chance of delamination of the cobalt from the underlying layer. In some examples, the cleaning process 124, ALD process 128, first cobalt deposition process 132, and second cobalt deposition process 134 are performed in-situ. In other words, they are performed in the same chamber.

Figure 1J:
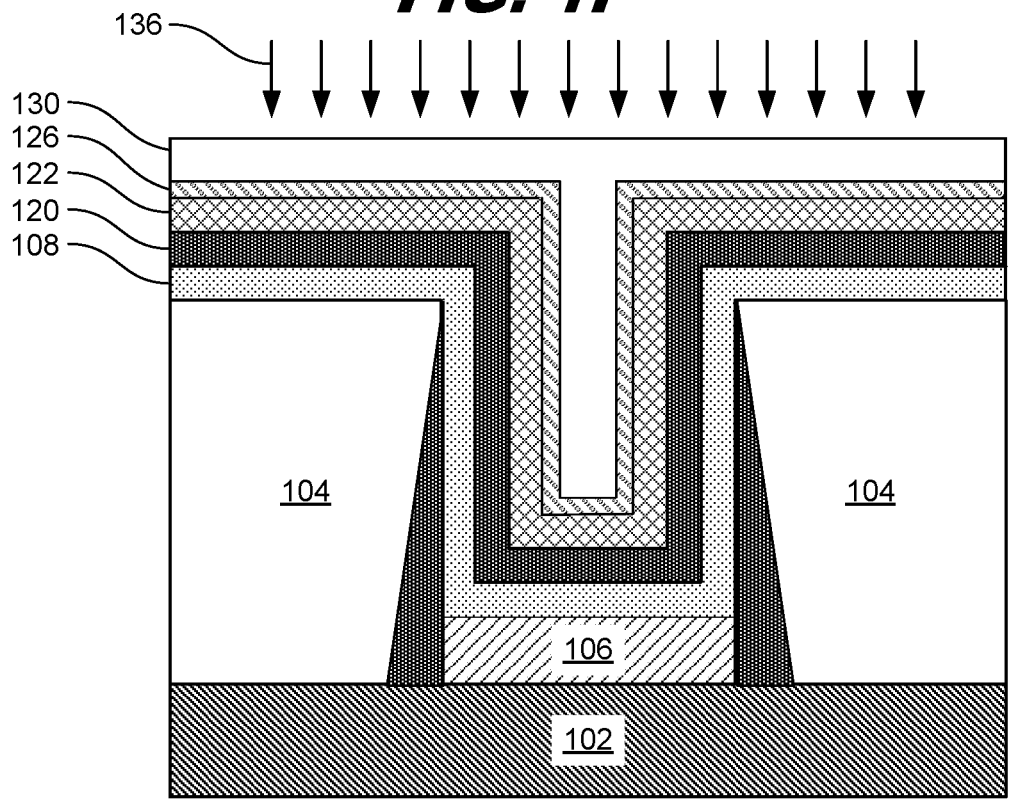

FIG. 1J illustrates an ECP process 136 to fill the remaining trench with cobalt. An ECP process uses an electric current to form a thin metal coating on a surface. In the present example, an electric current is applied to the cobalt layer 130 so that cobalt within the chamber of the electroplating tool is deposited onto the cobalt layer 130 to fill the trench. In some examples, filling in the trench may involve applying the ECP process to form a cobalt layer having a thickness of about 1500 Angstroms.

In some examples, after the ECP process 136 is applied, a high temperature annealing process is applied. This annealing process may utilize a hydrogen gas. This annealing process may be applied at a temperature within a range of about 250-400 degrees Celsius. This annealing process causes a reflow of the cobalt material to fill in any voids. Thus, by creating a cobalt gate in this manner, a higher quality gate with fewer voids and lower contact resistance can be realized. Additionally, the hydrogen gas used in this process may prevent oxidation of the cobalt during the annealing process.

Figure 1K:
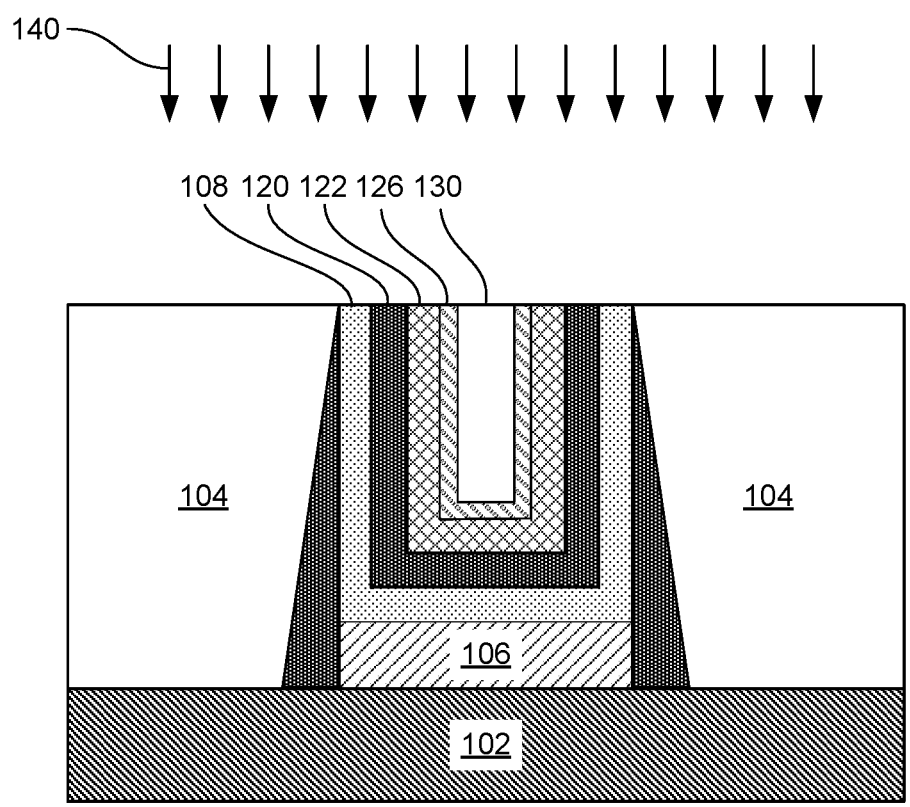

FIG. 1K is a diagram showing the final gate stack after a Chemical Mechanical Polishing (CMP) process 140 is applied. The CMP process 140 is used to smooth and planarize the surface of the work-piece.

Figure 1L:
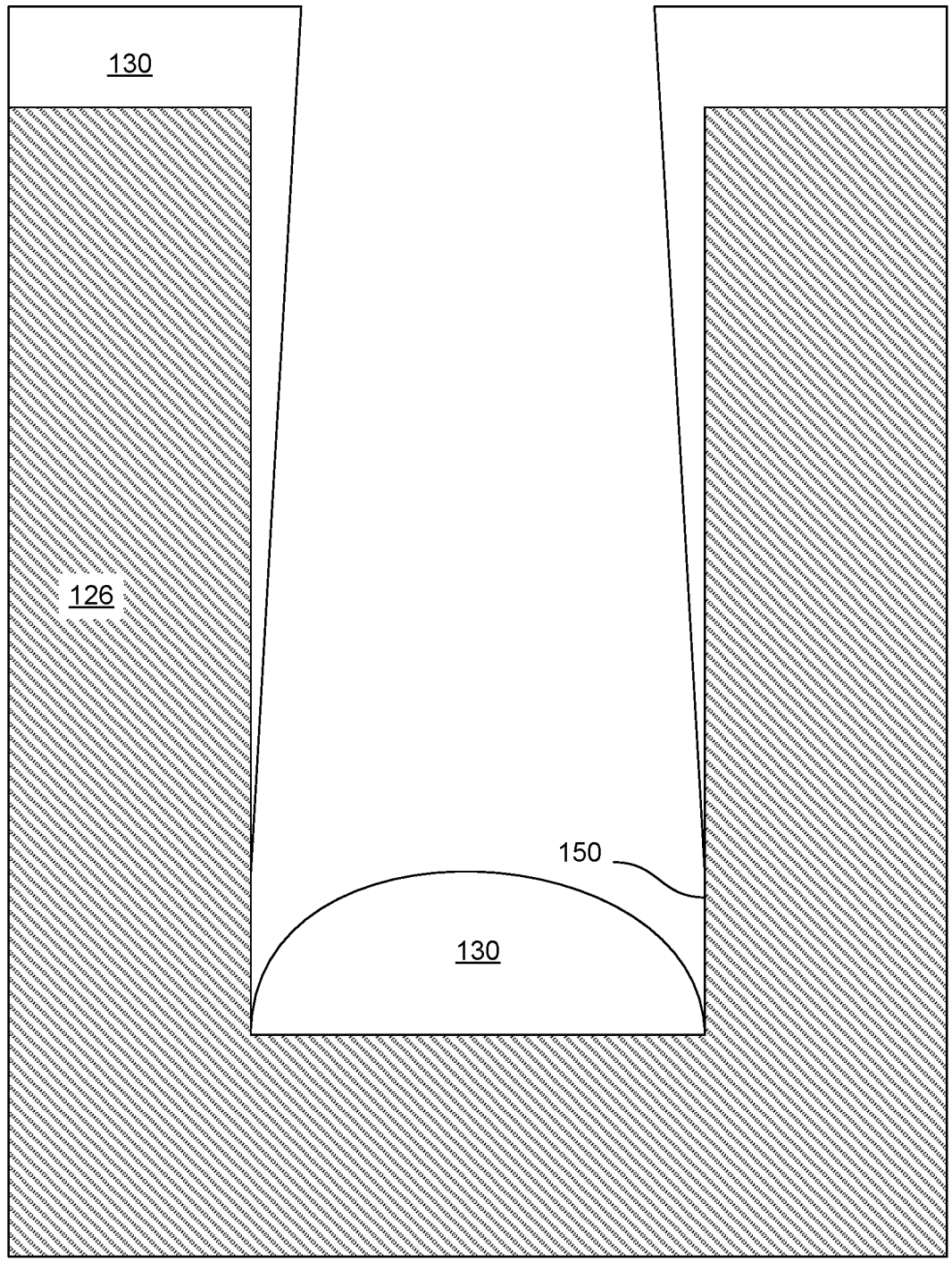

FIG. 1L is a close-up view of the trench after the first cobalt deposition process 132 is applied. Because the first cobalt deposition process is directional, material forms on the bottom of the trench but does not form very well on the sidewalls. This leaves some exposed portions 150 on the sidewalls of the trench. However, these exposed portions will not allow the ECP process to properly form the rest of the cobalt layer.

Figure 1M:
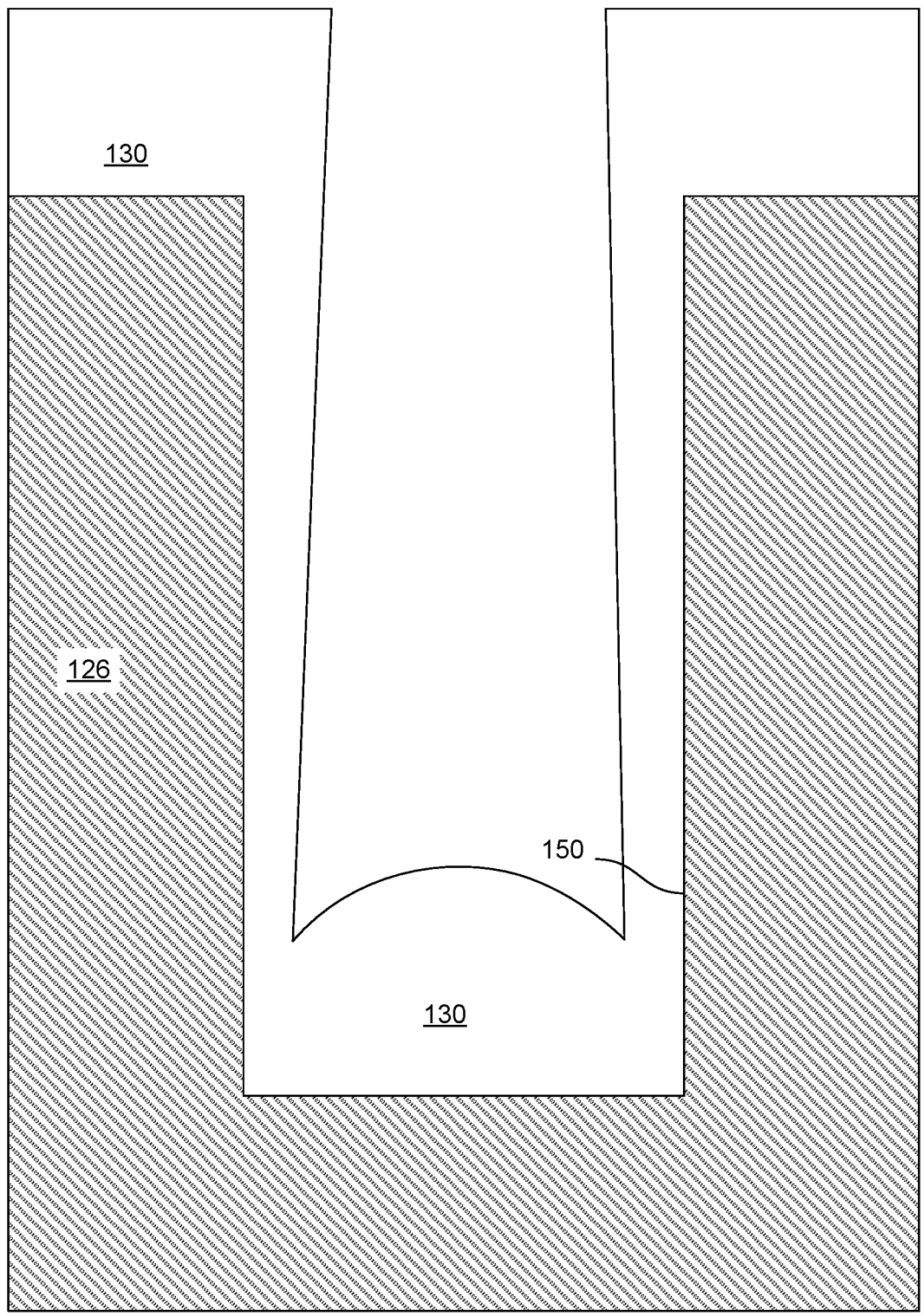

FIG. 1M is a close-up view of the trench after the second cobalt deposition process 134 is applied. This process is non-directional and thus forms the cobalt on the sidewalls as well, thus covering the exposed portions 150.

FIGS. 2A-2I are diagrams showing an illustrative process for forming a gate structure of a p-type transistor with a cobalt fill. The p-type transistor is similar to the n-type transistor but does not include the work function metal layers. According to the present example, an ILD layer 204 is formed on a substrate 202. The substrate 202 may be a semiconductor substrate such as a silicon germanium substrate. In one example, the substrate 202 may be part of a silicon wafer. In some examples, the substrate 202 may be part of a silicon germanium fin structure formed onto a substrate.

The ILD layer 204 may be deposited onto the substrate using a deposition process. In some examples, to form the trench 203, a dummy layer is formed on the substrate 202. The dummy layer may then be patterned to form dummy gates. Sidewall spacers may also be formed on sidewalls of the dummy gates. The ILD layer 204 may then be deposited over the dummy gates. The dummy gates may then be removed, thus leaving the trench 203 as defined by the sidewall spacers. In some examples, the trench 203 may be formed using photolithographic processes.

After the trench 203 is created, an interfacial layer 206 may be formed within the trench 203. The interfacial layer 206 is formed at the bottom of the trench and is not formed on the sidewalls of the trench 203. The interfacial layer 206 may be used to allow better adhesion of the high-k dielectric layer 208 to the substrate 202.

The high-k dielectric layer 208 may be, for example, hafnium oxide (e.g., $HfO_2$, $HfZrO_2$, $HfLaO_2$). Other dielectric materials may be used as well. The high-k dielectric layer 208 may be formed conformally within the trench. In other words, the high-k dielectric layer 208 is formed along both the sidewalls and bottom of the trench 203.

Figure 2A:
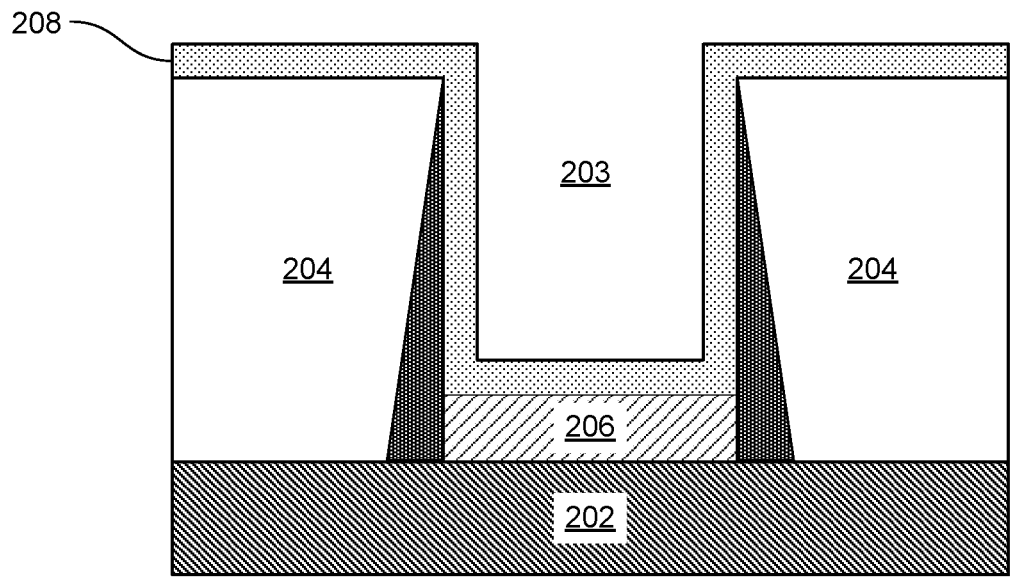
FIGS. 2A-2I are diagrams showing an illustrative process for forming a gate structure of a p-type transistor with a cobalt fill, according to one example of principles described herein.
Figure 2B:
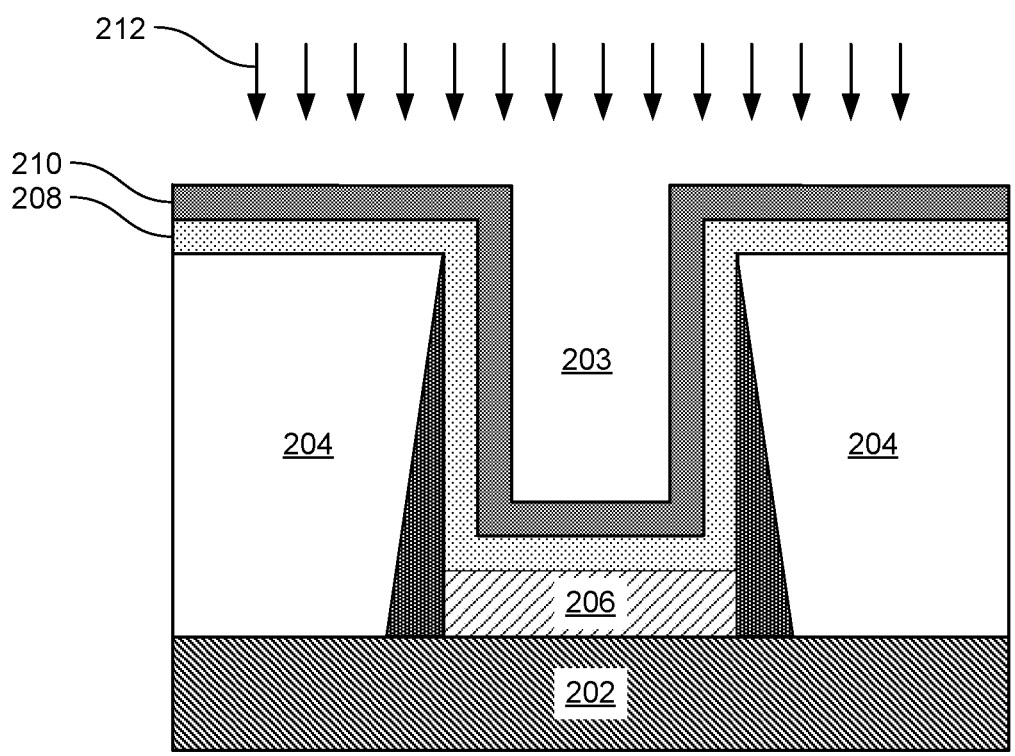

FIG. 2B illustrates the formation of a titanium silicon nitride (TiSiN) layer 210 followed by a post-metal annealing process 212. The TiSiN layer 210 may be formed conformally directly on the high-k dielectric layer 208. The annealing process 212 is then applied to cause diffusion into the high-k dielectric layer 208 to improve the properties of the high-k dielectric layer 208. The post-metal annealing process 212 may be applied at a temperature of about 850 degrees Celsius. The post-metal annealing process 212 may also utilize a nitrogen gas. The post-metal annealing process 212 may be applied in-situ. In other words, the process 212 is applied in the same chamber after the TiSiN layer 210 is formed.

Figure 2C:
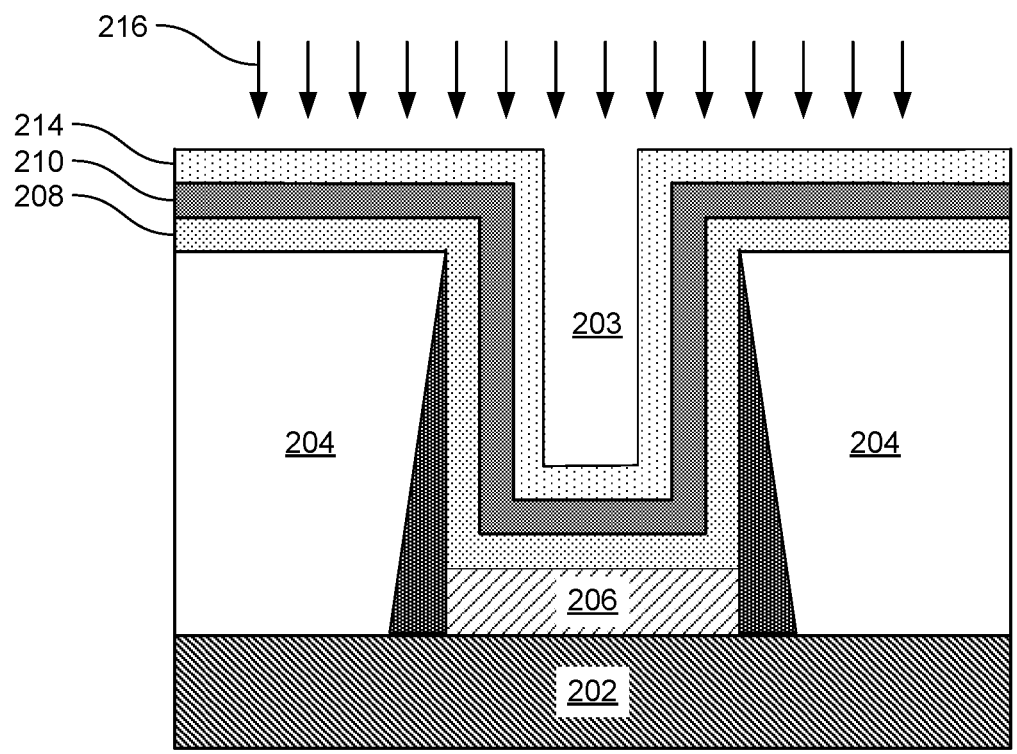

FIG. 2C illustrates the formation of a silicon capping layer 214 followed by a post-capping annealing process 216. The silicon capping layer 214 may be formed conformally over the TiSiN layer 214. The silicon capping layer may have a thickness within a range of about 20-40 Angstroms. The post-capping annealing process 216 may be applied at a temperature of about 900 degrees Celsius. The post-capping annealing process 216 may also utilize a nitrogen gas.

Figure 2D:
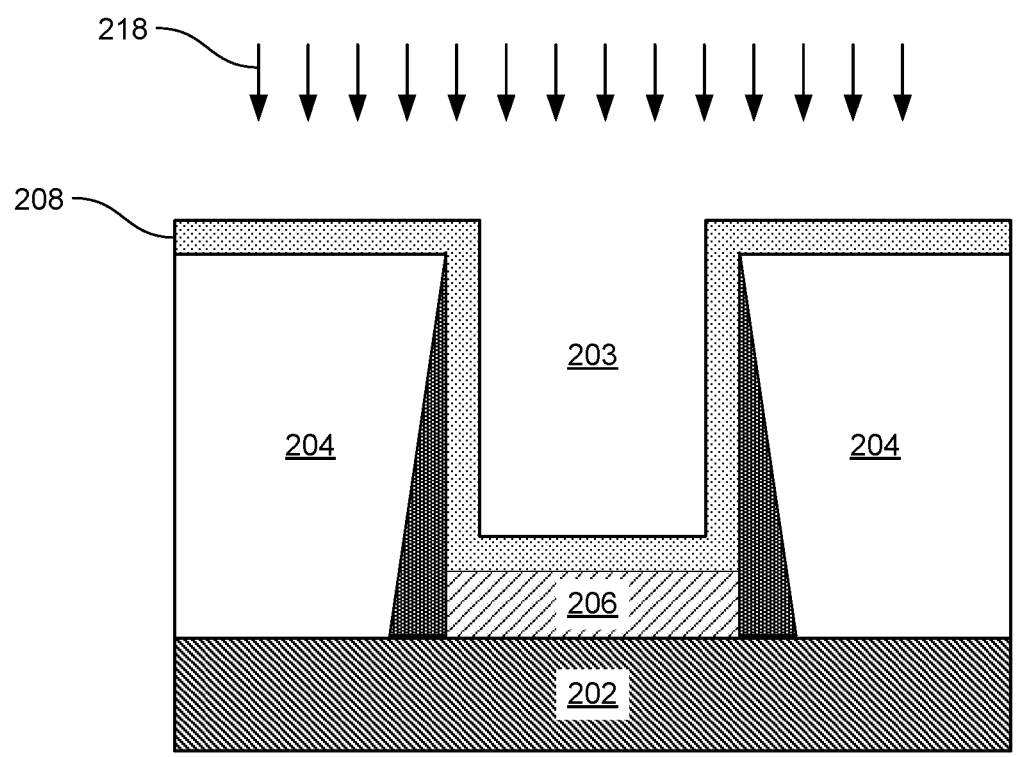

FIG. 2D illustrates a removal process 218 to remove the TiSiN layer 210 and the silicon capping layer 214. In some examples, the removal process includes two separate and distinct processes; one to remove the TiSiN layer 210 and one to remove the silicon capping layer 214. The layers 210, 214 may be removed using various etching processes. The etching processes may be selective so as to remove the layers 210, 214 without substantially affecting the high-k dielectric layer 208.

In some examples, work function metal layers (e.g., 120, 122) are formed over the entire substrate and then removed for regions corresponding to p-type devices.

Figure 2E:
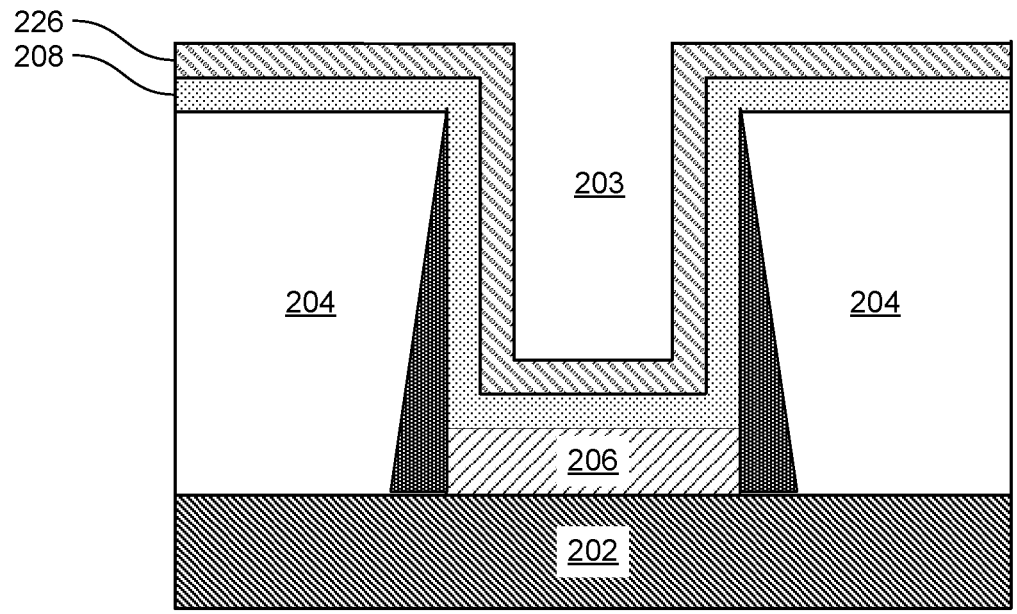

FIG. 2E illustrates the formation of a glue layer 226. The glue layer 226 may be, for example, a titanium nitride layer. In one example, the titanium nitride glue layer 226 is formed using an atomic layer deposition (ALD) process. ALD involves depositing alternating types of small layers in a self-limiting manner until the desired thickness is reached. In some examples, the glue layer 226 may be formed using about 40-80 ALD cycles. The temperature for the ALD process may be within a range of about 400-450 degrees Celsius. In some examples, the ALD process may use titanium chloride (TiCl4) or ammonia (NH3) as a precursor.

Figure 2F:
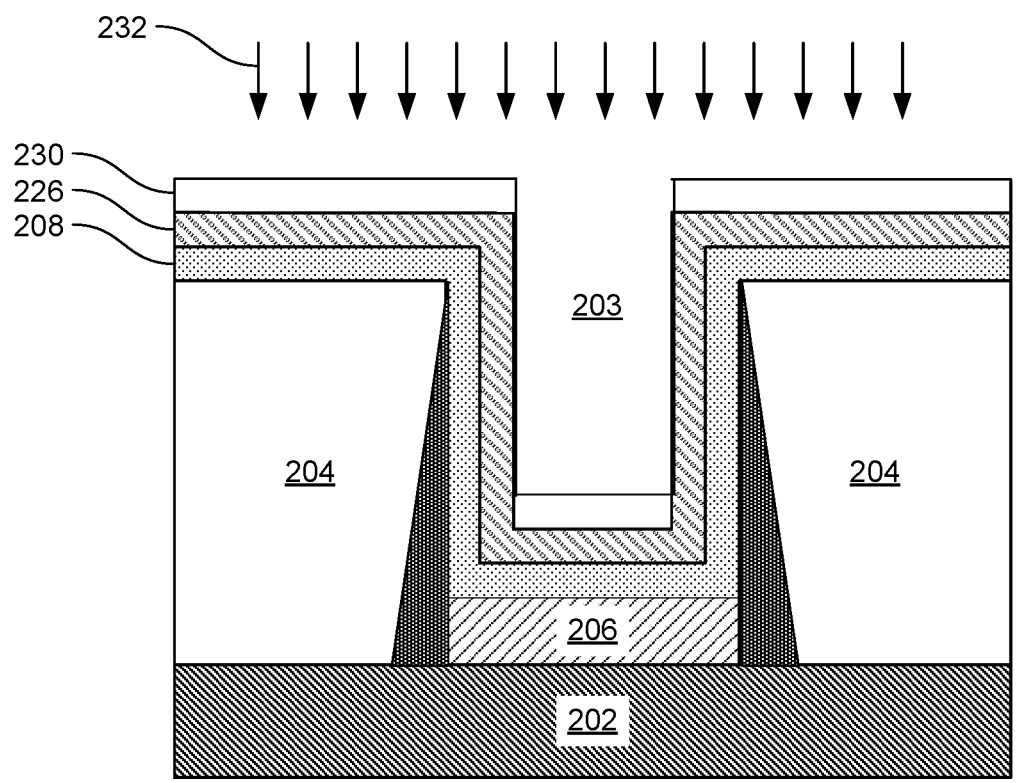

FIG. 2F illustrates a first cobalt deposition process 232. The first cobalt deposition process 232 forms a cobalt layer 230 on the glue layer 226. The first cobalt deposition process may be a PVD process. In some examples, the PVD process may be a directional PVD process. Thus, the first cobalt deposition process 232 results in more material on the bottom of the trench than on the sidewalls of the trench. The PVD process 232 may form the cobalt layer 230 with a thickness within a range of about 10-30 Angstroms.

Figure 2G:
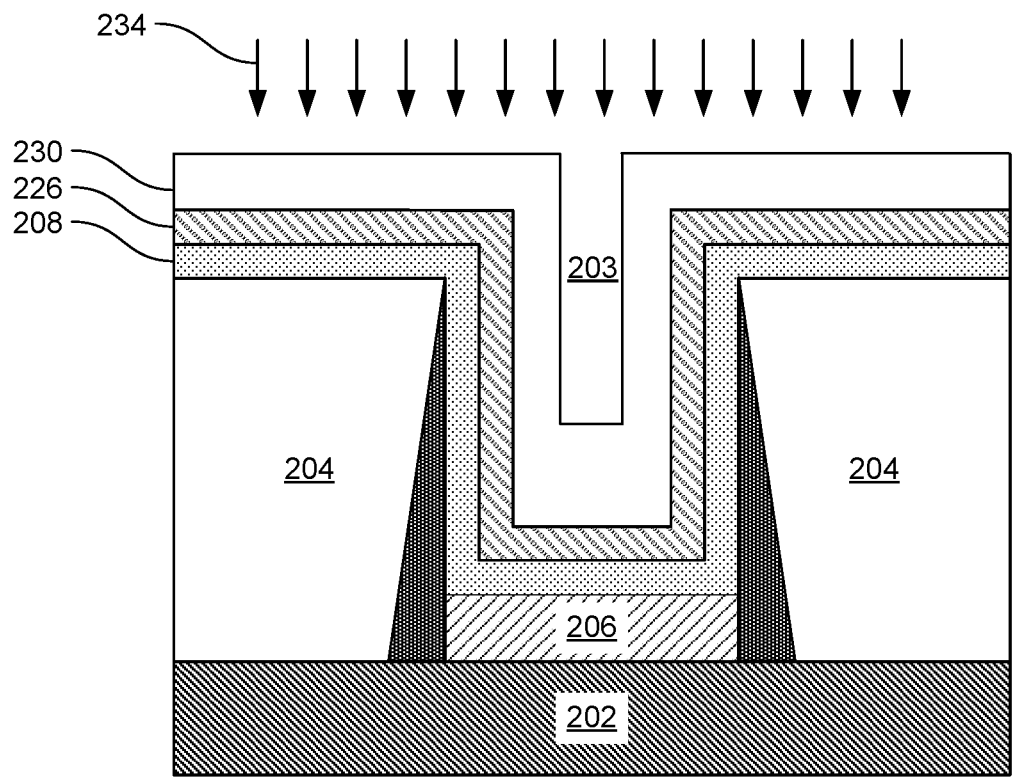

FIG. 2G illustrates a second cobalt deposition process 234. The second cobalt deposition process 234 increases the thickness of the cobalt layer 230. The second cobalt deposition process 234 may be a CVD process. The CVD process may be a non-directional process and thus will form material on sidewalls of the trench as thick as on the bottom of the trench. The CVD deposition process may increase the thickness of the cobalt layer within a range of about 10-30 Angstroms. The CVD deposition process 234 may be applied at a temperature within a range of about 150-250 degrees Celsius. The CVD deposition process may have a pressure within a range of about 5-15 torr. The CVD deposition process may use dicobalt hexacarbonyl tert-butyl acetylene (CCTBA) and hydrogen (H2) plasma as a precursor.

Figure 2H:
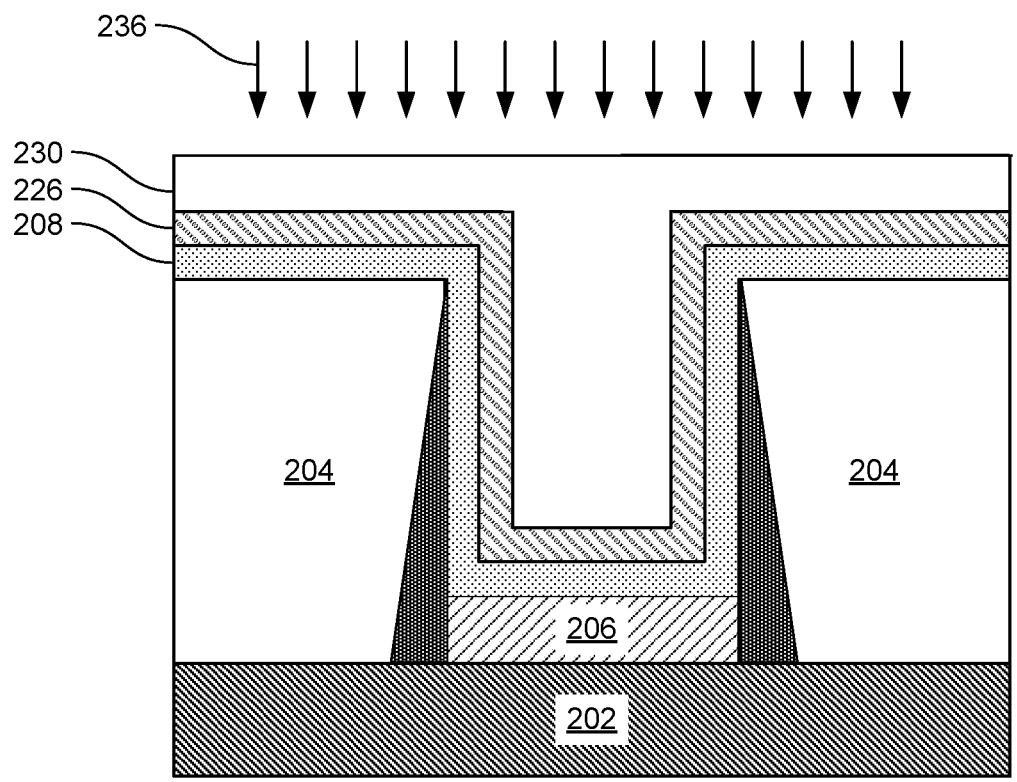

FIG. 2H illustrates an ECP process 236 to fill the remaining trench with cobalt. An ECP process uses an electric current to form a thin metal coating on a surface. In the present example, an electric current is applied to the cobalt layer 230 so that cobalt within the chamber of the electroplating tool is deposited onto the cobalt layer 230 to fill the trench. In some examples, filling in the trench may involve applying the ECP process to form a cobalt layer having a thickness of about 1500 Angstroms.

In some examples, after the ECP process 236 is applied, a high temperature annealing process is applied. This annealing process may utilize a hydrogen gas. This annealing process may be applied at a temperature within a range of about 250-400 degrees Celsius.

The cobalt layer 230 acts as a seed layer for the ECP cobalt formation process 236. Because the first cobalt deposition process 232 is a directional process, it forms more material on the bottom of the trench then on the sidewalls of the trench. In order to get the seed layer formed on the sidewalls, the second cobalt deposition process 234 is used. Having a cobalt layer 230 with a thicker bottom than the sidewalls provides various advantages. Specifically, having a cobalt layer 230 with a thicker bottom than the sidewalls allows the ECP process to be applied more effectively. Also, a cobalt layer 230 with a thicker bottom than the sidewalls improves the reflow process that occurs during the annealing process. Specifically, experimentation has shown that having a cobalt layer 230 with a greater thickness on the bottom reduces the formation of voids during the reflow process and reduces the chance of delamination of the cobalt from the underlying layer. In some examples, the cleaning process 224, ALD process 228, first cobalt deposition process 232, and second cobalt deposition process 234 are performed in-situ. In other words, they are performed in the same chamber.

Figure 2I:
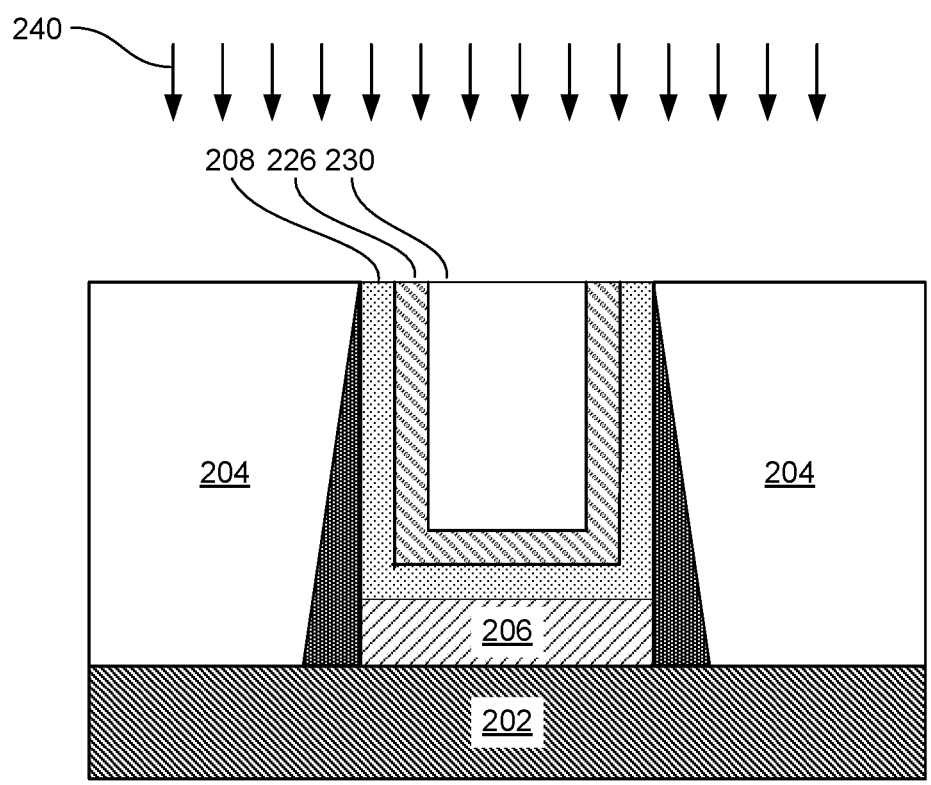

FIG. 2I is a diagram showing the final gate stack after a Chemical Mechanical Polishing (CMP) process 240 is applied. The CMP process 240 is used to smooth and planarize the surface of the work-piece.

Figure 3:
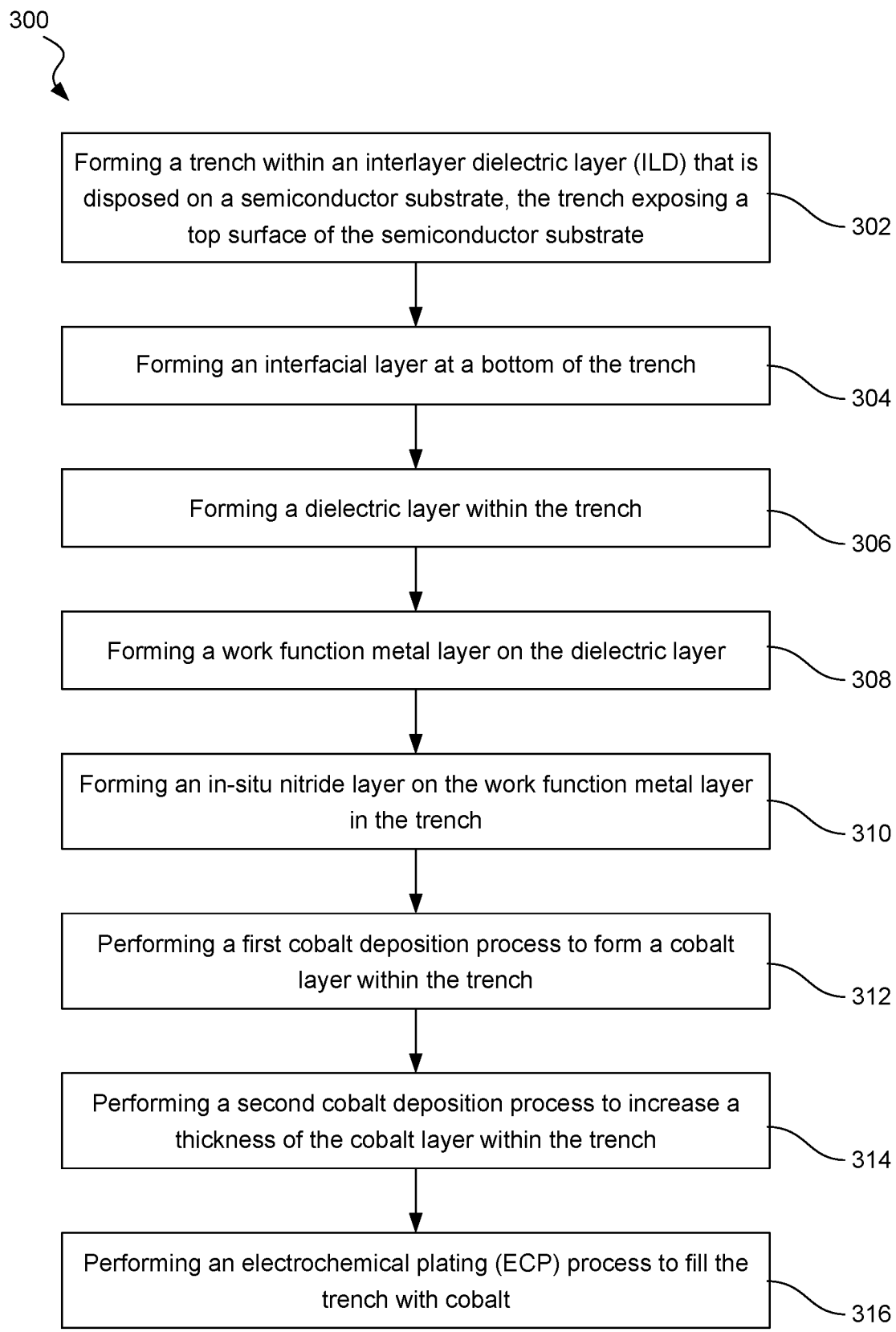
FIG. 3 is a flowchart showing an illustrative method for forming a gate structure with a cobalt fill, according to one example of principles described herein.

FIG. 3 is a flowchart showing an illustrative method for forming a gate structure with a cobalt fill. According to the present example, the method 300 includes a process 302 for forming a trench (e.g., 103, 203) within an interlayer dielectric layer (ILD) (e.g., 104, 204) that is disposed on a semiconductor substrate (e.g., 102, 202), the trench exposing a top surface of the semiconductor substrate. The ILD layer may be deposited onto the substrate using a deposition process. In some examples, to form the trench, a dummy layer is formed on the substrate 202. The dummy layer may then be patterned to form dummy gates. Sidewall spacers may also be formed on sidewalls of the dummy gates. The ILD layer may then be deposited over the dummy gates. The dummy gates may then be removed, thus leaving the trench as defined by the sidewall spacers. In some examples, the trench may be formed using photolithographic processes.

The method further includes a process 304 for forming an interfacial layer (e.g., 106, 206) at a bottom of the trench. The interfacial layer 106 is formed at the bottom of the trench and is not formed on the sidewalls of the trench. The interfacial layer may be used to allow better adhesion of a high-k dielectric layer to the substrate.

The method 300 further includes a process 306 for forming a dielectric layer (e.g., 108, 208) within the trench. The high-k dielectric layer may be, for example, hafnium oxide. Other dielectric materials may be used as well. The high-k dielectric layer may be formed conformally within the trench. In other words, the high-k dielectric layer is formed along both the sidewalls and bottom of the trench.

In some examples, the dielectric layer may be treated to improve its properties. For example, treating the dielectric layer may include the formation of a titanium silicon nitride (TiSiN) layer followed by a post-metal annealing process. The TiSiN layer may be formed conformally directly on the high-k dielectric layer. The annealing process is then applied to cause diffusion into the dielectric layer to improve the properties of the dielectric layer. The post-metal annealing process may be applied at a temperature of about 850 degrees Celsius. The post-metal annealing process may also utilize a nitrogen gas. The post-metal annealing process may be applied in-situ. In other words, the process is applied in the same chamber after the TiSiN layer is formed.

The treatment process for the dielectric layer may further include the formation of a silicon capping layer followed by a post-capping annealing process. The silicon capping layer may be formed conformally over the TiSiN layer. The silicon capping layer may have a thickness within a range of about 20-40 Angstroms. The post-capping annealing process may be applied at a temperature of about 900 degrees Celsius. The post-capping annealing process may also utilize a nitrogen gas.

After the annealing process a removal process may be used to remove the TiSiN layer and the silicon capping layer. In some examples, the removal process includes two separate and distinct processes; one to remove the TiSiN layer and one to remove the silicon capping layer. The layers may be removed using various etching processes. The etching processes may be selective so as to remove the layers without substantially affecting the high-k dielectric layer.

The method 300 further includes a process 308 for forming a work function metal layer on the dielectric layer. The work function layer may include a titanium aluminum carbide (TiAlC) layer and a titanium nitride (TiN) layer. Such layers may be formed using deposition processes. The work function are used for giving the gate structure desirable properties. For regions where p-type transistors are formed, the work function metal layers may be removed, while such layers remain intact over regions for n-type transistors.

The method 300 further includes a process 310 for forming an in-situ nitride layer, which may be a glue layer (e.g., 126, 226), on the work function metal layer. The glue layer may be, for example, a titanium nitride layer. In one example, the titanium nitride glue layer is formed using atomic layer deposition (ALD). ALD involves depositing alternating types of small layers in a self-limiting manner until the desired thickness is reached. In some examples, the glue layer may be formed using about 40-80 ALD cycles. The temperature for the ALD process may be within a range of about 400-450 degrees Celsius. In some examples, the ALD process may use titanium chloride (TiCl4) or ammonia (NH3) as a precursor.

In some examples, before the glue layer is formed, the surface on which the glue layer is to be formed may be cleaned using a cleaning process (e.g., 124). The cleaning process may involve using tungsten chloride (WCl5) or tantalum chloride (TaCl5). The cleaning process may be applied at a temperature within a range of about 300-500 degrees Celsius. In some examples, the cleaning process is applied at a pressure within a range of about 5-15 torr. Other cleaning mechanisms may be used as well.

The method 300 further includes a process 312 for performing a first cobalt deposition process to form a cobalt layer (e.g., 130, 230) within the trench. The first cobalt deposition process forms a cobalt layer on the glue layer. The first cobalt deposition process may be a PVD process. In some examples, the PVD process may be a directional PVD process. The PVD process may form the cobalt layer with a thickness within a range of about 10-30 Angstroms.

The method 300 further includes a process 314 for performing a second cobalt deposition process to increase a thickness of the cobalt layer within the trench. The second cobalt deposition process may be a CVD process. The CVD deposition process may increase the thickness of the cobalt layer within a range of about 10-30 Angstroms. The CVD deposition process may be applied at a temperature within a range of about 150-250 degrees Celsius. The CVD deposition process may have a pressure within a range of about 5-15 torr. The CVD deposition process may use dicobalt hexacarbonyl tert-butyl acetylene (CCTBA) and hydrogen (H2) plasma as a precursor.

The method 300 further includes a process 316 for performing an electrochemical plating (ECP) process to fill the trench with cobalt. An ECP process uses an electric current to form a thin metal coating on a surface. In the present example, an electric current is applied to the cobalt layer so that cobalt within the chamber of the electroplating tool is deposited onto the cobalt layer to fill the trench. In some examples, filling in the trench may involve applying the ECP process to form a cobalt layer having a thickness of about 1500 Angstroms.

According to one example, a method for forming a gate structure includes forming a trench within an interlayer dielectric layer (ILD) that is disposed on a semiconductor substrate, the trench exposing a top surface of the semiconductor substrate, forming an interfacial layer at a bottom of the trench, forming a dielectric layer within the trench, forming a work function metal layer on the dielectric layer, forming an in-situ nitride layer on the work function metal layer in the trench, performing a first cobalt deposition process to form a cobalt layer within the trench, performing a second cobalt deposition process to increase a thickness of the cobalt layer within the trench, and performing an electrochemical plating (ECP) process to fill the trench with cobalt.

According to one example, a method for forming a gate structure includes forming a nitride layer within a trench, performing a first cobalt deposition process to form a cobalt layer within the trench, performing a second cobalt deposition process to increase a thickness of the cobalt layer within the trench, and performing an electrochemical plating (ECP) process to fill the trench with cobalt.

According to one example, a gate structure includes an interfacial layer disposed on a semiconductor substrate, a work function metal layer disposed on the dielectric layer and conformed to the interfacial layer, a dielectric layer over and conformed to the work function metal layer, a titanium nitride glue layer over and conformed to the dielectric layer, and a cobalt layer disposed on the titanium nitride glue layer, the cobalt layer being disposed within a center of the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a gate structure, the method comprising:
    forming a trench within an interlayer dielectric layer (ILD) that is disposed on a semiconductor substrate, the trench exposing a top surface of the semiconductor substrate;
    forming a dielectric layer within the trench;
    forming a work function metal layer on the dielectric layer, wherein the work function metal layer includes a first titanium nitride layer;
    performing a cleaning process to remove an oxidized portion of the first titanium nitride layer, resulting in a treated work function metal layer;
    forming a second titanium nitride layer on the treated work function metal layer in the trench;
    performing a first cobalt deposition process to form a cobalt layer over the second titanium nitride layer, wherein the cobalt layer has a first thickness on a sidewall surface of the trench and a second thickness on a bottom surface of the trench, the first thickness being different from the second thickness;
    performing a second cobalt deposition process to increase the first thickness and the second thickness of the cobalt layer within the trench; and
    performing an electrochemical plating (ECP) process to fill the trench with cobalt.

2. The method of claim 1, further comprising:
    depositing a titanium silicon nitride layer on the dielectric layer; and
    performing a first annealing process with nitrogen gas.

3. The method of claim 2, further comprising:
    depositing a silicon capping layer on the titanium silicon nitride layer;
    performing a second annealing process; and
    removing the titanium silicon nitride layer and the silicon capping layer.

4. The method of claim 1, wherein the work function metal layer further includes a titanium aluminum carbide layer.

5. The method of claim 1, further comprising, removing the work function metal layer in regions corresponding to p-type transistors.

6. The method of claim 1, wherein the second titanium nitride layer is formed using an atomic layer deposition process.

7. The method of claim 6, wherein the atomic layer deposition process forms a layer that has a thickness within a range of about 10-30 angstroms by performing about 40-80 deposition cycles at about 400-450 degrees Celsius using titanium chloride and ammonia as a precursor.

8. The method of claim 1, wherein the first cobalt deposition process is a physical vapor deposition (PVD) process and the second cobalt deposition process is a chemical vapor deposition (CVD) process, and wherein the CVD process forms a layer that has a thickness within a range of about 10-30 angstroms, at a temperature within a range of about 150-250 degrees Celsius and a pressure within a range of about 5-15 torr using hydrogen gas as a precursor.

9. The method of claim 1, wherein a portion of a sidewall surface of the second titanium nitride layer is exposed near the bottom surface of the trench.

10. The method of claim 1, wherein performing the cleaning process includes applying tungsten chloride or tantalum chloride.

11. The method of claim 1, wherein removing the portion of the first titanium nitride layer, forming the second titanium nitride layer, performing the first cobalt deposition process, and performing the second cobalt deposition process are implemented in a same chamber.

12. A method for forming a gate structure, the method comprising:
    forming a gate dielectric layer within a trench;
    forming a first titanium-containing nitride layer over the gate dielectric layer;
    performing a first annealing process to anneal the first titanium-containing nitride layer to treat the gate dielectric layer;

removing the annealed first titanium-containing nitride layer to expose the treated gate dielectric layer;

forming a work function metal layer over the treated gate dielectric layer, wherein the work function metal layer includes a second titanium-containing nitride layer having an oxidized portion;

removing the oxidized portion of the second titanium-containing nitride layer to form a treated work function metal layer;

forming a glue layer over the treated work function metal layer, wherein the glue layer includes a third titanium-containing nitride layer;

performing a first cobalt deposition process to form a first cobalt layer over the glue layer;

performing a second cobalt deposition process to form a second cobalt layer over the first cobalt layer; and performing an electrochemical plating (ECP) process to fill the trench with cobalt.

13. The method of claim 12, wherein the work function metal layer is configured to form an n-type device.

14. The method of claim 12, further comprising removing a portion of the treated work function metal layer to form a p-type device.

15. The method of claim 12, wherein the first cobalt deposition process is a physical vapor deposition (PVD), and the second cobalt deposition process is a chemical vapor deposition (CVD) process.

16. The method of claim 15, wherein the PVD process and the CVD process are performed in a same chamber.

17. The method of claim 12, further comprising, before forming the work function metal layer:

forming a silicon capping layer over the annealed first titanium-containing nitride layer;

performing a second annealing process to anneal the silicon capping layer; and removing the annealed silicon capping layer.

18. A method for forming a gate structure, the method comprising:

forming an interfacial layer disposed within a trench on a semiconductor substrate;

forming a gate dielectric layer on the interfacial layer within the trench;

forming a first titanium-containing nitride layer on the gate dielectric layer;

performing a first annealing process to anneal the first titanium-containing nitride layer to treat the gate dielectric layer;

removing the annealed first titanium-containing nitride layer to expose the treated dielectric layer;

forming a work function metal layer on the treated dielectric layer, wherein the work function metal layer includes a second titanium-containing nitride layer having an oxidized portion;

removing the oxidized portion of the work function metal layer to form a treated work function metal layer;

forming a glue layer that includes a third titanium-containing nitride layer over the treated work function metal layer;

performing a first cobalt deposition process to form a first cobalt sublayer over the glue layer;

performing a second cobalt deposition process to form a second cobalt sublayer over the first cobalt sublayer, wherein the second deposition process differs from the first deposition process; and performing an electrochemical plating (ECP) process to fill the trench with cobalt.

19. The method of claim 18, wherein removing the oxidized portion of the third titanium nitride layer includes applying tungsten chloride or tantalum chloride.

20. The method of claim 18, further comprising, before forming the work function metal layer:

forming a silicon capping layer over the annealed first titanium-containing nitride layer;

performing a second annealing process to anneal the silicon capping layer; and removing the annealed silicon capping layer.

* * * * *